United States Patent [19]
Tennyson

[11] Patent Number: 5,117,203
[45] Date of Patent: May 26, 1992

[54] PHASE STABLE LIMITING POWER AMPLIFIER

[75] Inventor: William R. Tennyson, Utica, N.Y.

[73] Assignee: General Electric Company, Syracuse, N.Y.

[21] Appl. No.: 627,011

[22] Filed: Dec. 13, 1990

[51] Int. Cl.[5] .............................................. H03F 1/34
[52] U.S. Cl. ..................................... 330/294; 330/302
[58] Field of Search ............... 330/107, 109, 292, 293, 330/294, 296, 302, 303, 286

[56] References Cited
U.S. PATENT DOCUMENTS

4,028,629  6/1977  Ringland ........................ 330/302 X
4,879,525  11/1989  Larkin ................................ 330/294

*Primary Examiner*—Steven Mottola
*Attorney, Agent, or Firm*—Paul Checkovich; Richard V. Lang

[57] ABSTRACT

A phase stable limiting power amplifier includes a transistor, having a bias voltage applied to the collector and one applied to the base for operation in a class AB configuration. Input impedance matching circuitry may be coupled to the base with output impedance matching circuitry coupled to the collector. The input and output impedance matching circuitry may include only reactive elements for maximizing amplifier gain. Instability suppression circuitry may be connected between the base and the emitter. Representative functional characteristics for facilitating component selection and selection of operation conditions are provided.

7 Claims, 5 Drawing Sheets

PHASE STABLE LIMITING POWER AMPLIFIER

BACKGROUND OF THE INVENTION

The present invention relates to a power amplifier, and, more particularly, to a power amplifier that is substantially phase stable while operating over a region of substantially constant (limited) output power.

In certain applications, such as, for example, supplying RF energy to a plurality of transmitting sections of a phased-array radar antenna, it is desirable to maintain the power level to each section within predetermined power and phase limits in order to assure proper sidelobe reduction and beam-steering accuracy, respectively, over the desired RF frequency operating range. For example, in a phased-array radar system, a transmission path may include class C power amplifier stages. Such path may typically exhibit amplitude modulation (AM) to phase modulation (PM) conversion factor, or drive phase pushing, on the order of 20°/dB, which places severe demands on drive power level tolerance, or prohibits achieving close tolerances on transmission path phase accuracy.

It would be desirable to provide an amplifier able to maintain a constant output power level, such as for example 10 watts, and a constant transmission phase within small tolerances over a useful range of input power. In addition, it would be desirable to provide a simple scheme for establishing a good impedance match to the input port of the amplifier from a source and appropriate load matching, and especially complex output port matching, for efficient amplifier operation. By "useful range of input power" is meant that the amplifier is able to accommodate a range of input power that is beneficial to the user or operator of the amplifier in the selected application of the amplifier at the desired frequencies of operation.

Accordingly, it is an object of the present invention to provide an amplifier able to maintain a constant output power level and a constant transmission phase within small tolerances over a useful range of input power.

Another object of the present invention is to provide a simple scheme for establishing source and load impedance matching and especially complex output port matching, of an amplifier to a source and load impedance, respectively, for efficient amplifier operation.

SUMMARY OF THE INVENTION

In accordance with the present invention, a phase stable limiting power amplifier comprises a transistor having a collector, an emitter and a base for operating in a common emitter mode, input impedance matching means, having an input for receiving an input signal to be amplified and an output coupled to the base of the transistor, for matching the input impedance of the amplifier to the impedance of a source of the input signal, output impedance matching means, having an input connected to the collector of the transistor and an output for providing an amplified signal in response to the input signal, for providing appropriate, such as optimum, load impedance between the collector and the emitter for achieving desired performance of the amplifier with respect to transmission phase and limiting output power, and instability suppression means having one port connected to the base and another port connected to the collector for suppressing instabilities in the amplifier. Ideally, constant transmission phase and constant limiting output power is desired.

The amplifier further includes first biasing means having an output connected to the collector for supplying a first biasing voltage to the collector and second biasing means having an output connected to the base for supplying a second biasing voltage to the base for effecting a class AB biasing scheme. The value of the second biasing voltage is selected to be between the voltage of the collector and emitter when the first biasing voltage is applied and the value of the input signal is zero and may be further selected to urge a current in a flowpath including the first biasing means, the collector and the emitter during operation. For an NPN type transistor the value of the second biasing voltage may be about 0.7 volts with respect to the emitter.

The input impedance matching means may include a plurality of capacitance means coupled to its output, wherein a portion of the total value of capacitance desired at the output of the input impedance matching means is assigned to, or apportioned between or among, each of the plurality of capacitance means for avoiding self-resonance.

The input and output impedance matching means may each include only reactive elements for maximizing gain of the amplifier. For example, the input impedance matching means may include first capacitance means and first inductive means electrically coupled in series in that order between the input and output of the input impedance matching means, and second capacitance means electrically coupled between the electrical junction of the first capacitance means and the inductive means and a common electrical potential. Continuing with the example, the output impedance matching means may include second inductive means electrically coupled in series between the input and output of the output impedance matching means, and third capacitance means electrically coupled in series between the output of the output impedance matching means and the common electrical potential, wherein in both cases the emitter is coupled to the common electrical potential.

The features of the invention believed to be novel are set forth with particularity in the appended claims. The invention itself, however, both as to organization and method of operation, together with further objects and advantages thereof, may best be understood by reference to the detailed description taken in connection with the accompanying drawing.

DETAILED DESCRIPTION

Figure 1:
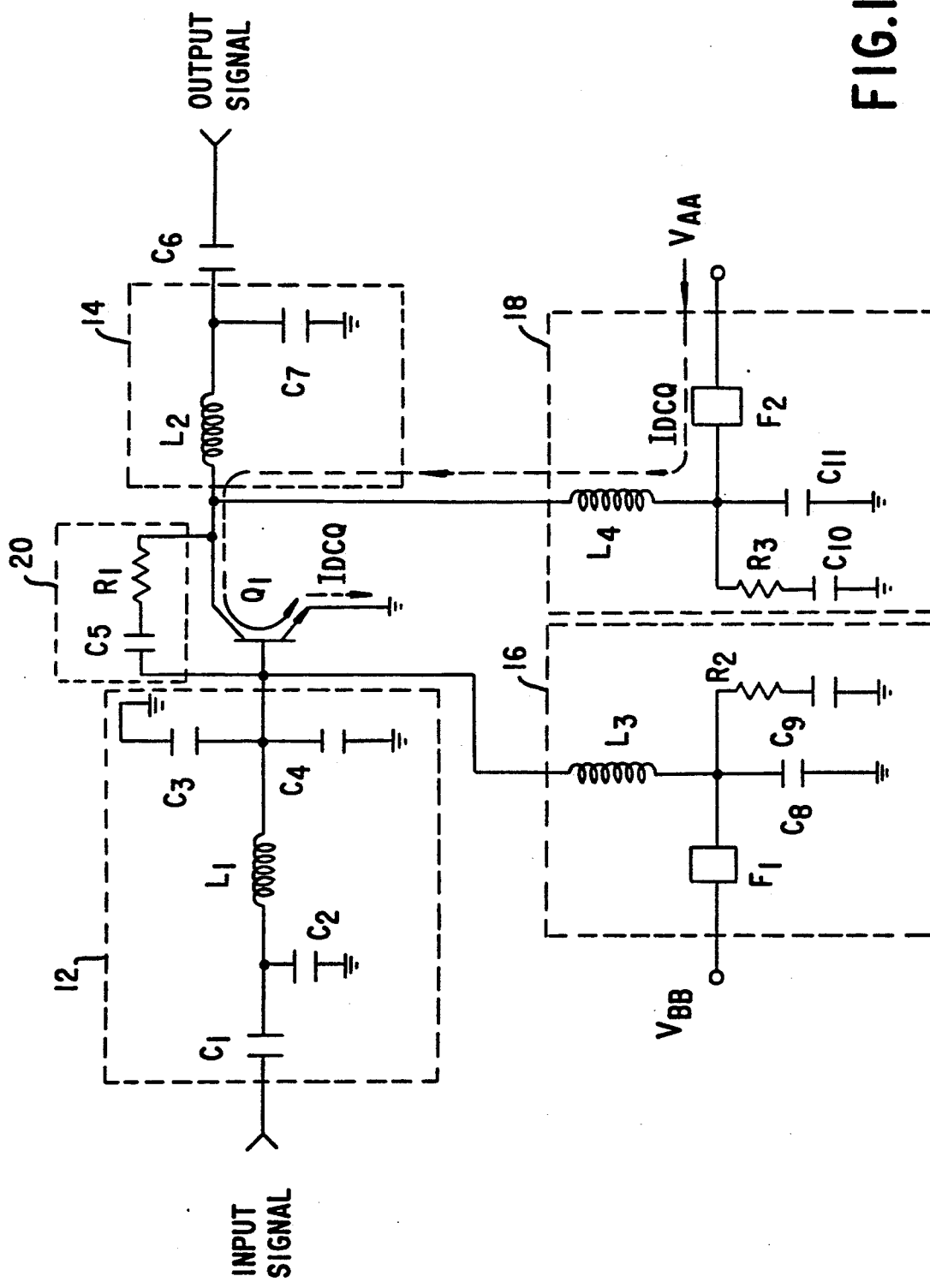
FIG. 1 is a schematic diagram of an amplifier in accordance with the present invention.

Referring to FIG. 1, a schematic diagram of an amplifier in accordance with the present invention is shown. The amplifier comprises a transistor $Q_1$ having a collector, base and emitter, and that is operationally connected in a common emitter configuration, input impedance matching means 12 having its output connected to the base of transistor $Q_1$, output impedance matching means 14 having an input connected to the collector of transistor $Q_1$, first biasing means 16, having its output connected to the base of transistor $Q_1$, second biasing means 18, having its output connected to the collector of transistor $Q_1$, and instability suppression means 20, having one port connected to the base and another port connected to the collector of transistor $Q_1$.

Input impedance matching means 12 include an impedance network having a coupling, or DC blocking, capacitor $C_1$ with one terminal, which constitutes an input of impedance matching means 12, adapted for receiving an input signal to be conditioned and amplified by the amplifier. The other terminal of capacitor $C_1$ is connected to one terminal of both parallel shunt impedance matching capacitor $C_2$ and series impedance matching inductor $L_1$. The other terminal of capacitor $C_2$ is connected to a common voltage reference level which is indicated as ground, or earth, potential. The other terminal of inductor $L_1$, which constitutes the output of input impedance matching means 12, is connected to one terminal of each of parallel impedance matching capacitors $C_3$ and $C_4$. The other terminal of each of capacitors $C_3$ and $C_4$ is connected to the common voltage reference level. The output of input impedance matching means 12 is connected to the base of transistor $Q_1$.

Capacitors $C_3$ and $C_4$ are typically about one-half the value of the total lumped capacitance that is desired to be connected to the other terminal of inductor $L_1$. A single capacitor having a capacitance value that is substantially the same as the capacitance value of the sum of the capacitance values of capacitors $C_3$ and $C_4$ may be used in place of capacitors $C_3$ and $C_4$. However, by assigning the desired capacitance between capacitors $C_3$ and $C_4$, self-resonance of a capacitor having a larger capacitance value is avoided.

Instability suppression means 20 include series blocking capacitor $C_5$ having one terminal constituting the port of suppression means 20 that is connected to the base of transistor $Q_1$. The other terminal of capacitor $C_5$ and a terminal of resistor $R_1$ are connected together and the other terminal of resistor $R_1$ constitutes the port of suppression means 20 that is connected to the collector of transistor $Q_1$, so that capacitor $C_5$ and resistor $R_1$ are electrically sequentially connected in series between the base and collector of transistor $Q_1$.

The values of capacitor $C_5$ and resistor $R_1$ are predeterminedly selected so that capacitor $C_5$ presents substantially an AC short circuit path, with suppression means 20 thereby constituting resistive shunt feedback, between the collector and base of transistor $Q_1$ over a very wide range of frequencies above the frequency where the impedance of capacitor $C_5$ falls below the resistance of resistor $R_1$ for instability, such as oscillation, suppression without a significant use of output power of the amplifier.

Output impedance matching means 14 include an impedance network having a series impedance matching inductor $L_2$ with one terminal constituting the input of impedance matching means 14. The other terminal of inductor $L_2$, which constitutes the output of impedance matching means 14, is connected to one terminal of parallel shunt impedance matching capacitor $C_7$. The other terminal of capacitor $C_7$ is connected to the common voltage reference level. The output of impedance matching means 14 has available the amplified signal that is generated by the amplifier in response to the input signal and which is supplied through series coupling, or DC blocking, capacitor $C_6$ as the output signal of the amplifier. As shown, impedance matching means 14, provides complex load matching for transistor $Q_1$.

First biasing means 16 include a filter capacitor $C_8$ having one terminal connected to one terminal of ferrite bead $F_1$, to one terminal of resistor $R_2$ and to one terminal of biasing inductor, or choke, $L_3$. The other terminal of inductor $L_3$ constitutes the output of biasing means 16. The other terminal of resistor $R_2$ is connected to one terminal of capacitor $C_9$ being with the other terminal of capacitors $C_8$ and $C_9$ connected to the common voltage reference level.

The values for the circuit elements of the series combination of resistor $R_2$ and capacitor $C_9$ are selected to provide a substantially resistive impedance at frequencies that are below the desired operating frequency of the amplifier for maintaining unconditional stability of the amplifier at the source port (this is base-emitter port) of transistor $Q_1$. The value of capacitor $C_8$ is selected to exhibit a very low impedance at the operating frequency of the amplifier to maintain substantially lossless impedance matching at the input port (that is, the input of matching means 12) of the amplifier. The other terminal of ferrite $F_1$, which constitutes the input of biasing means 16, is connected to a source $V_{BB}$ of a first biasing voltage. Ferrite bead $F_1$ presents a substantially DC short circuit, and moderate to high impedance, from a few MHz to the desired operating frequencies for bias line decoupling.

Second biasing means 18 include a filter capacitor $C_{11}$ having one terminal connected to one terminal of ferrite bead $F_2$, to one terminal of resistor $R_3$ and to one terminal of biasing inductor, or choke, $L_4$. The other terminal of inductor $L_4$ constitutes the output of biasing means 18. The other terminal of resistor $R_3$ is connected to one terminal of capacitor $C_{11}$ with the other terminal of capacitors $C_{10}$ and $C_{11}$ being connected to the common voltage reference level.

The values for the circuit elements of the series combination of resistor $R_3$ and capacitor $C_{10}$ are selected to provide a substantially resistive impedance a frequencies that are below the desired operating frequency of the amplifier for ensuring unconditional stability of the amplifier at the load port of transistor $Q_1$. The value of capacitor $C_{11}$ is selected to exhibit a very low impedance at the operating frequency of the amplifier to maintain substantially lossless impedance matching at the output port of the amplifier. The other terminal of ferrite $F_2$, which constitutes the input of biasing means 18, is connected to a source $V_{AA}$ of a second biasing voltage. Ferrite bead $F_2$ presents a substantially DC short circuit, and moderate to high impedance, at the desired operating frequencies for bias line decoupling.

Ferrite $F_1$ and $F_2$ may be a model 2643000101 ferrite bead available from the Fairrite Corporation, Wallkill, N.Y., or the like.

In operation, the value of voltage from source $V_{AA}$ is selected for biasing the collector of transistor $Q_1$ more positive than the emitter of transistor $Q_1$, and typically may be in the range of greater than about +5 volts when transistor $Q_1$ is an NPN type transistor. Of course other types of transistors or amplifying devices may be used in accordance with the teachings of the present invention.

Once the value of voltage from source $V_{AA}$ is selected, the value of voltage from source $V_{BB}$ may be determined. With no input signal, or an input signal having a zero voltage value, applied to the input port of the amplifier, the value of voltage from source $V_{BB}$ is selected so that the voltage applied to the base of transistor $Q_1$ lies between the voltage of the collector and that of the emitter. That is, the base of transistor $Q_1$ is biased more positive than the emitter but less positive than the collector of transistor $Q_1$ so that a quiescent current $I_{DCQ}$ will flow from source $V_{AA}$ through the collector and emitter of transistor $Q_1$. Typically, such bias voltage on the base of transistor $Q_1$ will be about 0.7 VDC with respect to the emitter of transistor $Q_1$ when transistor $Q_1$ is an NPN type.

Biasing transistor $Q_1$ with voltage from both source $V_{AA}$ and $V_{BB}$ as shown may be considered to be a class AB type bias for transistor $Q_1$ of the amplifier. One acceptable characterization of a class AB amplifier is one in which the base bias voltage is such that collector current in the transistor flows for appreciably more than half but less than an entire cycle of the input signal.

Typically current $I_{DCQ}$ may be about 500 milliamperes for an NPN type transistor at a nominal output power level of about 10 watts. Generally the value of current $I_{DCQ}$ may be determined by considering factors such as desired gain, output power, phase stability, operating frequency and operating characteristics of transistor $Q_l$. The voltage from source $V_{BB}$ may be applied continuously, or may be gated at least for conserving energy so that it is only present during predetermined intervals, such as when a predetermined portion of the input signal supplied to the input port of the amplifier is desired to be amplified.

Transistor $Q_1$ is selected for its ability to handle the desired power levels and frequencies without distortion and/or breakdown, for its ability to be biased in a class AB mode and for its ability to provide useful gain and phase stability characteristics during operation. A representative transistor meeting these requirements is a model PT9702 that is available from TRW, or the like.

Figure 2A:
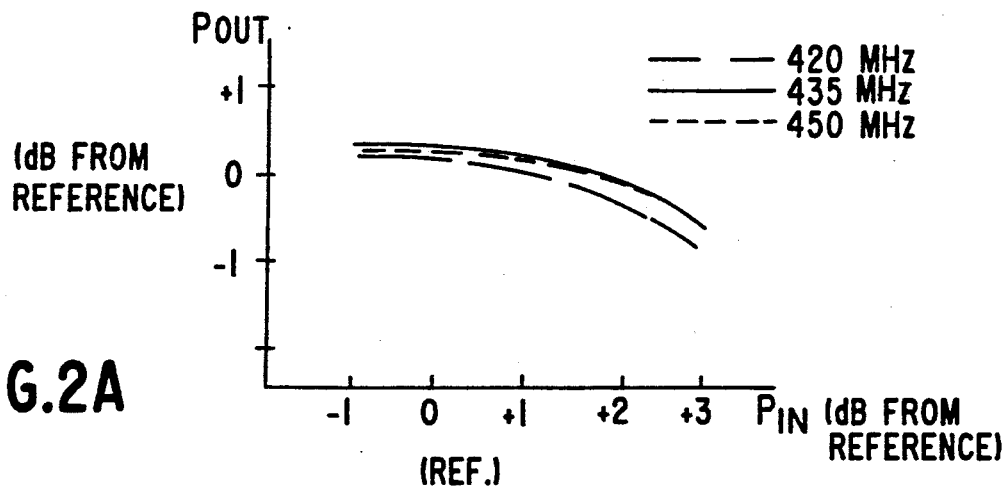
FIGS. 2A, 2B and 2C include graphs of a number of operating characteristics of the amplifier of FIG. 1.
Figure 2B:
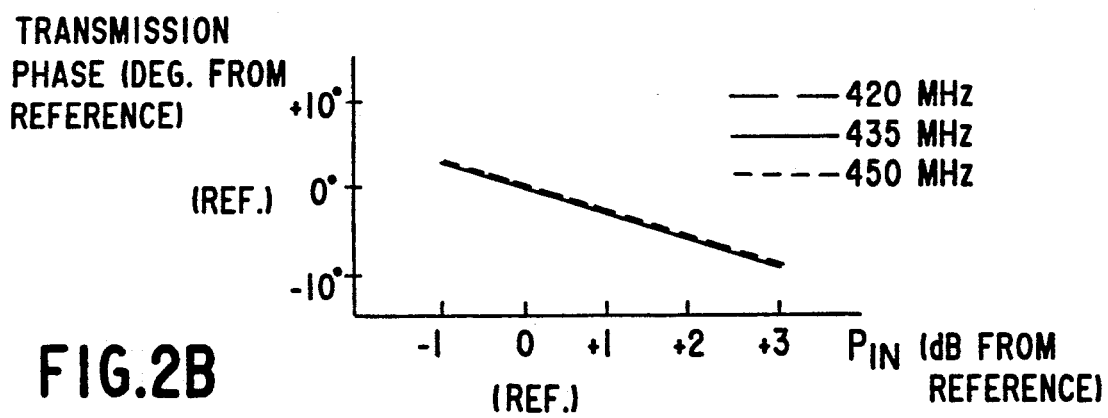
Figure 2C:
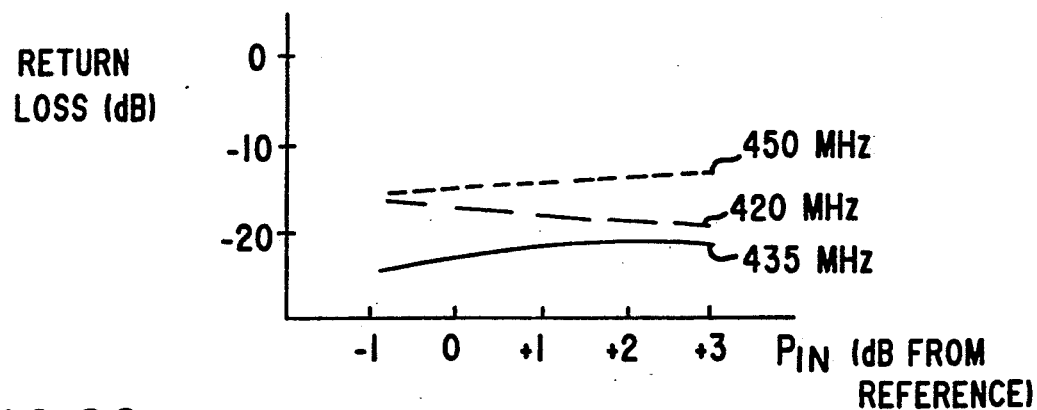

Referring to FIGS. 2A, 2B and 2C, measured operating characteristics of a circuit as in FIG. 1 using both lumped circuit components, and microstrip circuit components for inductors $L_1$ and $L_2$ are shown. The three illustrated operating characteristics (output power ($P_{out}$), transmission phase and return loss) are all plotted along the ordinate in response to the same input power $P_{in}$ levels as plotted along the abscissa. For output power, the reference level of the output signal was nominally 10 watts peak, while for input power, the reference level of the input signal was nominally 5 watts peak, which represents about a 3 dB gain for the amplifier, over a 30 MHz band centered at 435 MHz.

It is noted that over the input power range of $-1$ dB to $+1$ dB with respect to the reference level, the output power is substantially constant while the transmission phase varies from about $+3.5°$ to about $-3.5°$ over the same input power range, or about 3.5°/dB. This represents almost an order of magnitude improvement from the 20°/dB typically experienced by prior amplifiers. Transmission phase is defined as the phase difference between the input and output signals of the amplifier, which ideally is desired to be constant.

Referring to FIGS. 3A, 3B, 3C and 3D, a series of graphs showing the effect of altering bias conditions for the circuit of FIG. 1 is shown.

The values for plotting the graphs of FIGS. 3A-3D were obtained at about 435 MHz with a nominal reference input power $P_{in}$ of 5 watts peak and a nominal reference output power $P_{out}$ of 10 watts peak. The graphs of FIGS. 3A-3D, or ones obtained using other circuit elements in accordance with the teaching of the present invention, may be beneficially employed by the amplifier designer for selecting the desired biasing conditions of the amplifier.

Figure 3A:
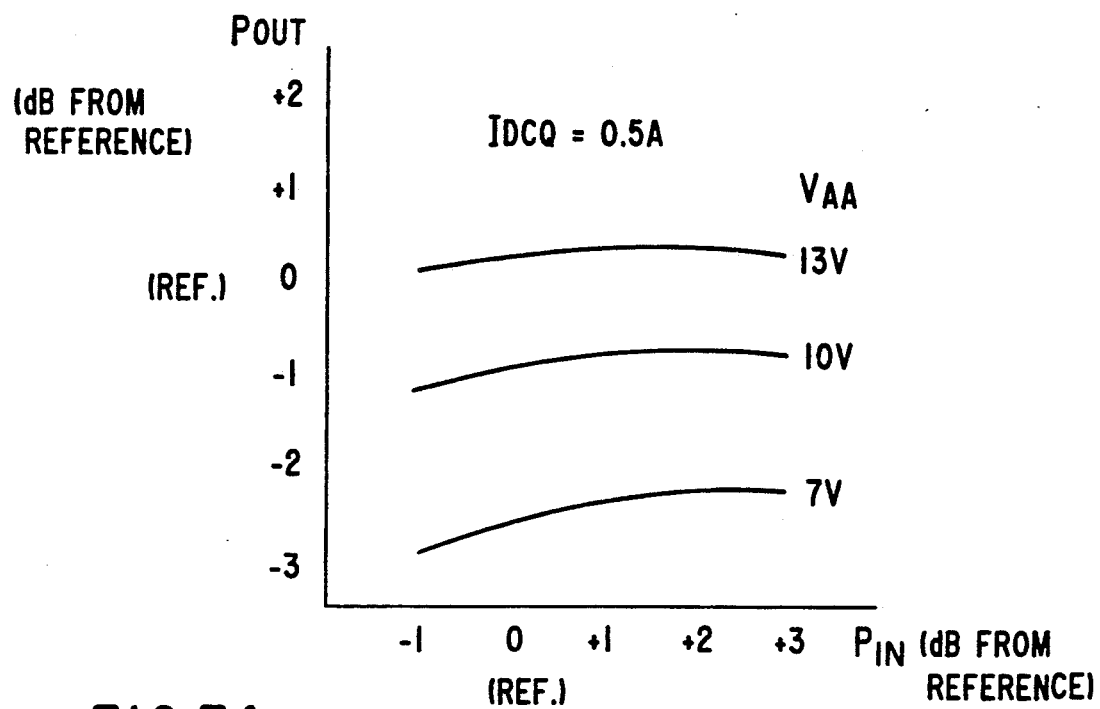
FIGS. 3A, 3B, 3C and 3D are a series of graphs showing the effects of altering bias conditions for the amplifier of FIG. 1.
Figure 3B:
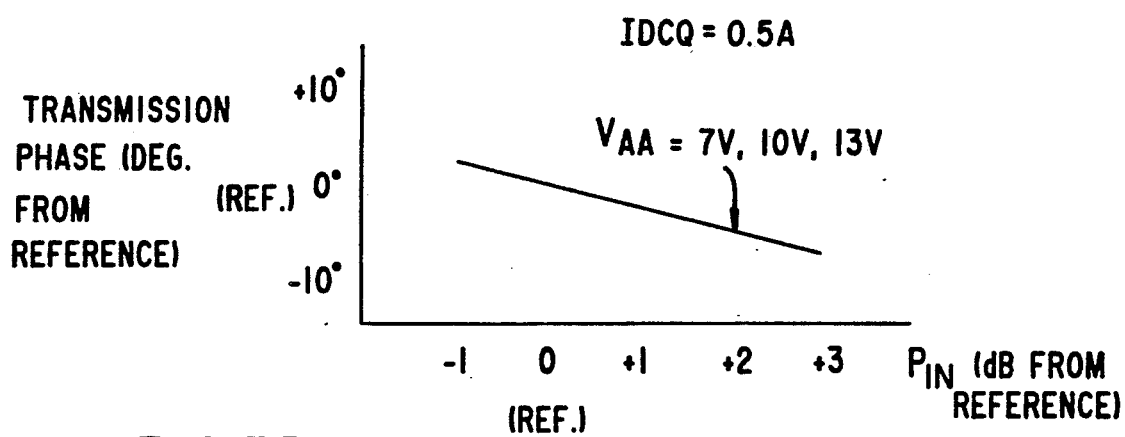

FIG. 3A shows the effect on output power $P_{out}$ of keeping $I_{DCQ}$ constant at 0.5 A and applying the voltage value from source $V_{AA}$ at 13 V, 10 V and 7 V over the indicated range of input power $P_{in}$. FIG. 3B shows the effect on transmission phase of keeping $I_{DCQ}$ constant at 0.5 A and applying the voltage value from source $V_{AA}$ at 13 V, 10 V and 7 V over the indicated range of input power $P_{in}$. FIG. 3B shows the effect on transmission phase of keeping $I_{DCQ}$ constant at 0.5 A and applying the voltage value from source $V_{AA}$ at 13 V, 10 V and 7 V over the indicated range of input power $P_{in}$.

Figure 3C:
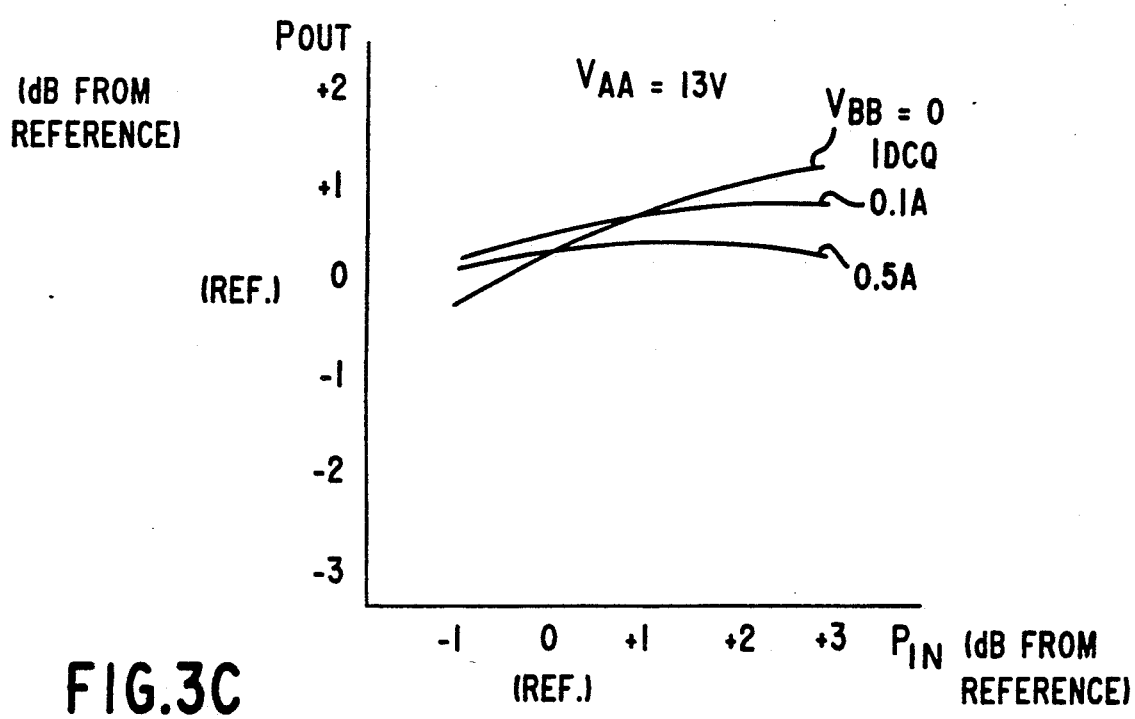
Figure 3D:
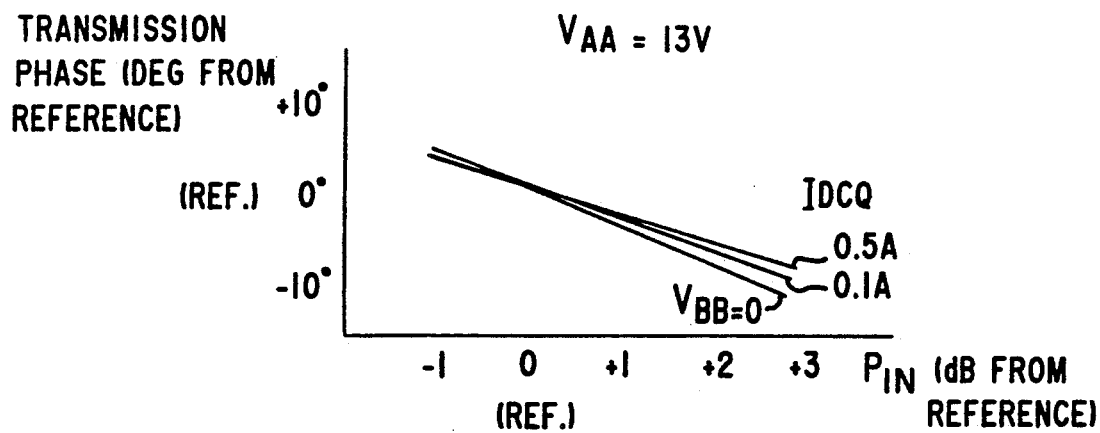

FIG. 3C illustrates the effect on output power $P_{out}$ of keeping the voltage value from source $V_{AA}$ constant at 13 V and applying the voltage from source $V_{BB}$ at zero volts, and at voltage values which yield a value of current for $I_{DCQ}$ of 0.1 A and 0.5 A over the indicated range of input power $P_{in}$. FIG. 3D illustrates the effect on transmission phase of maintaining the voltage value from source $V_{AA}$ constant at 13 V and applying the voltage from source $V_{BB}$ at zero volts, and at voltage values which yield a value of current for $I_{DCQ}$ of 0.1 A and 0.5 A over the indicated range of input power $P_{in}$.

Figure 4A:
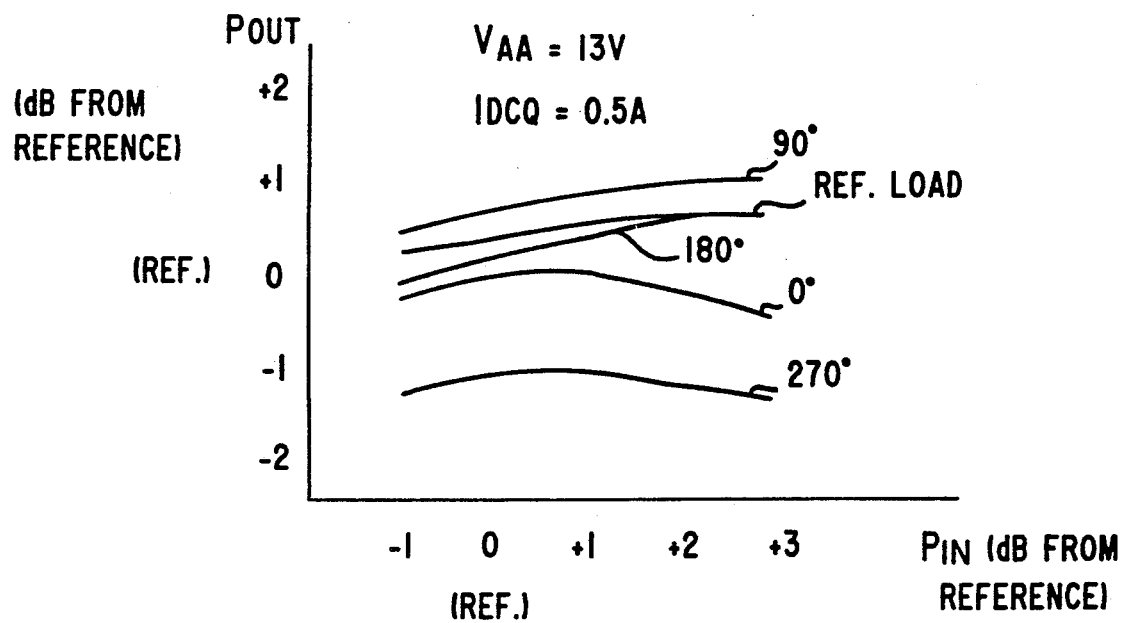
FIGS. 4A and 4B are graphs illustrating the relative effect of load impedance variations on characteristics of the amplifier of FIG. 1.
Figure 4B:
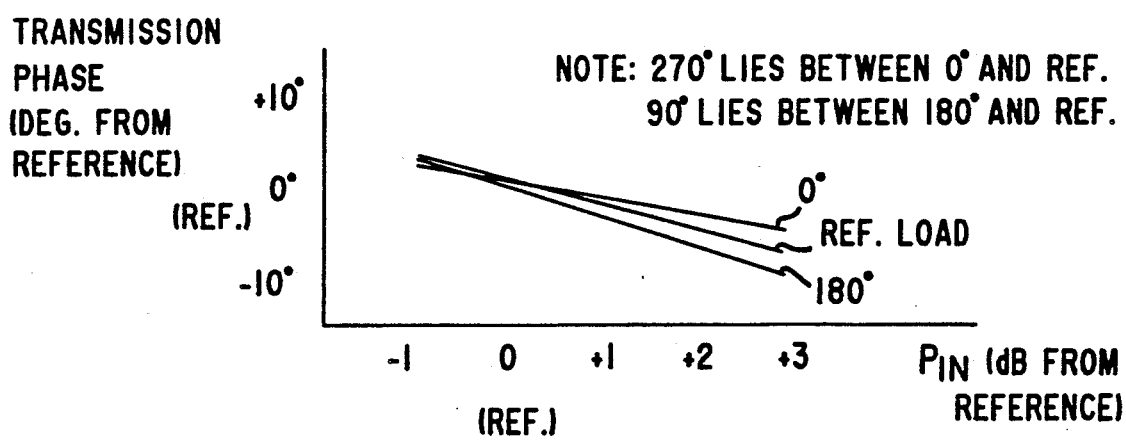

Referring to FIGS. 4A and 4B graphs illustrating the relative effect of load impedance variations on characteristics of the amplifier of FIG. 1 are shown. Data for the graphs of FIGS. 4A and 4B were collected at a nominal operating frequency of 435 MHz with voltage from source $V_{AA}$ at about 13 V and voltage from source $V_{BB}$ selected to provide current $I_{DCQ}$ at about 0.5 A. The value of capacitor $C_7$ and inductor $L_2$ were selected for subjective optimum operation. That is, these values were selected to provide the flattest $P_{out}$ and transmission phase curves versus input power over the range shown to provide a nominal output power $P_{out}$ of 10 watts peak into a nominal amplifier $50+j0$ ohms load. The curves labelled REF LOAD in FIGS. 4A and 4B represent such optimum operation.

An external tuner, including a stub tuner (for coefficient reflection magnitude adjustment) and a line stretcher (for phase rotation adjustment), was then connected between the output port (that is, the terminal of capacitor $C_6$ at which the output signal is available) of the amplifier, and the load having a $50+j0$ ohm impedance. The external tuner was adjusted to effect a 10 dB magnitude return loss mismatch at the output port of the amplifier with the electrical angle indicative of a reactive component of the load able to be adjusted through 360°. This is nominally equivalent to a 1.93:1 VSWR circle simulation. Data for obtaining the curves of FIGS. 4A and 4B were taken at 90° increments on the 10 dB mismatch circle.

By way of example only, and for completeness of description, the values of the circuit elements for an amplifier in accordance with FIG. 1, and upon which data for determining the curves of FIG. 2 were obtained, are listed in the Table. It is to be understood that such values are in no way intended to limit the scope of this invention.

The load port (that is, the collector-emitter port) impedance matching means 14 provides a complex load impedance of $11.5+j5.4$ ohms for transistor $Q_1$ at 435 MHz. Inductor $L_2$ and capacitor $C_7$ transform the load impedance (selected to be nominally $50+j0$ ohms) to provide the desired impedance as seen by transistor $Q_1$. The values obtained for inductor $L_2$ and capacitor $C_7$ are listed in the Table. The value of capacitor $C_6$ was then selected to be a very low impedance at the desired operating frequency compared to the impedance of the load, which was selected to be about 50 ohms resistive for design and demonstration purposes.

TABLE

| CIRCUIT ELEMENT | VALUE |
|---|---|
| Resistor $R_1$ | 100 ohms |
| Resistor $R_2$ | 51 ohms |
| Resistor $R_3$ | 51 ohms |
| Capacitor $C_1$ | 300 picofarads(pf) |
| Capacitor $C_2$ | 15 pf |
| Capacitor $C_3$ | 27 pf |
| Capacitor $C_4$ | 27 pf |
| Capacitor $C_5$ | .01 $\mu f$ |
| Capacitor $C_6$ | 300 pf |
| Capacitor $C_7$ | 18 pf |
| Capacitor $C_8$ | 300 pf |
| Capacitor $C_9$ | .01 $\mu f$ |
| Capacitor $C_{10}$ | .01 $\mu f$ |
| Capacitor $C_{11}$ | 300 pf |
| Inductor $L_1$ | .0037 $\mu h$ |
| Inductor $L_2$ | .0090 $\mu h$ |
| Inductor $L_3$ | .09 $\mu h$ |
| Inductor $L_4$ | .37 $\mu h$ |
| Ferrite Bead $F_1$ | Fairrite P/N 2643000101 |
| Ferrite Bead $F_2$ | Fairrite P/N 2643000101 |
| Transistor $Q_1$ | TRW PT9702 |

While only certain preferred features of the invention have been shown by way of illustration, many modifications and changes will occur to those skilled in the art. It is to be understood that the appended claims are intended to cover all such modifications and changes as fall within the true spirit and scope of the invention.

Thus has been illustrated and described an amplifier able to maintain constant power output and constant transmission phase within small tolerances over a useful range of input power.

What is claimed is:

1. A phase stable limiting power amplifier comprising:
   a transistor having a collector, an emitter and a base, the transistor for operating in a common emitter mode;
   input impedance matching means having an input for receiving an input signal to be amplified and an output coupled to the base of the transistor, the input impedance matching means for matching the input impedance of the amplifier to the impedance of a source of the input signal;
   output impedance matching means having an input coupled to the collector of the transistor and an output for providing an amplified signal in response to the input signal, the output impedance matching means for providing the appropriate load impedance between the collector and the emitter of the transistor for achieving desired performance of the amplifier with respect to transmission phase and limiting output power;
   first biasing means having an output coupled to the collector of the transistor, the first biasing means for supplying a first biasing voltage to the collector;
   second biasing means having an output coupled to the base of the transistor, the second biasing means for supplying a second biasing voltage to the base so that when the first biasing voltage is applied to the collector of the transistor and the second biasing voltage is applied to the base, and the value of the input signal is zero, the value of the voltage of the base of the transistor lies between the value of the voltage of the collector and that of the emitter of the transistor; and
   instability suppression means having one port coupled to the base and another port coupled to the collector of the transistor, the instability suppression means for suppressing instabilities in the amplifier.

2. The amplifier as in claim 1, wherein the second biasing voltage is selected to urge a first current in a flowpath including the first biasing means, the collector and the emitter of the transistor during operation.

3. The amplifier as in claim 2, wherein the transistor is an NPN type transistor and the second biasing voltage is selected to be about 0.7 V with respect to the emitter of the transistor when the first biasing voltage is applied and the voltage value of the input signal is zero.

4. The amplifier as in claim 1, wherein the input impedance matching means include a plurality of capacitance means coupled to its output, wherein a portion of the total value of capacitance desired at the output of the input impedance matching means is assigned to each of the plurality of capacitance means for avoiding self-resonance.

5. The amplifier as in claim 1, wherein the instability suppression means include capacitance means and resistive means electrically connected in series in the sequence recited between the base and collector of the transistor.

6. The amplifier as in claim 1, wherein the input impedance matching means and the output impedance matching means include only reactive elements for maximizing gain of the amplifier.

7. The amplifier as in claim 6, wherein:
   the input impedance matching means include first capacitance means and first inductive means electrically connected in series in the order recited between the input and output of the input impedance matching means, and second capacitance means electrically connected between the electrical junction of the first capacitance means and the first inductive means and a common electrical potential;
   the output impedance matching means include second inductive means electrically connected in series between the input and output of the output impedance matching means, and third capacitance means electrically connected in series between the output of the output impedance matching means and the common electrical potential,
   and further wherein the emitter of the transistor is connected to the common electrical potential.

* * * * *